(12) United States Patent
Laaksonen et al.

(10) Patent No.: US 8,843,338 B2
(45) Date of Patent: Sep. 23, 2014

(54) PROCESSING DATA FOR CALIBRATION

(75) Inventors: Mika H. Laaksonen, Oulu (FI); Vesa Koivuaho, Oulu (FI)

(73) Assignee: Nokia Corporation, Espoo (FI)

( * ) Notice: Subject to any disclaimer, the term of this patent is extended or adjusted under 35 U.S.C. 154(b) by 383 days.

(21) Appl. No.: 13/194,269

(22) Filed: Jul. 29, 2011

(65) Prior Publication Data

US 2013/0030745 A1   Jan. 31, 2013

(51) Int. Cl.
*G01C 17/38* (2006.01)
*G01R 35/00* (2006.01)
*G01R 33/00* (2006.01)

(52) U.S. Cl.
CPC .......... *G01R 33/0023* (2013.01); *G01R 35/005* (2013.01)
USPC ............................................ 702/93; 702/104

(58) Field of Classification Search
USPC ................. 702/85, 92, 93, 104; 324/244, 245
See application file for complete search history.

(56) References Cited

U.S. PATENT DOCUMENTS

| | | | |
|---|---|---|---|
| 5,046,031 A | 9/1991 | Wanous | 364/571.02 |
| 5,142,897 A * | 9/1992 | Pischke et al. | 73/1.81 |
| 5,435,070 A | 7/1995 | Kilian | 33/361 |
| 5,522,989 A | 6/1996 | Hove | 210/219 |
| 6,243,660 B1 | 6/2001 | Hsu et al. | 702/160 |
| 6,539,639 B2 | 4/2003 | Smith | 33/356 |
| 6,543,146 B2 | 4/2003 | Smith et al. | 33/356 |
| 6,651,003 B2 | 11/2003 | Woloszyk et al. | 701/224 |
| 6,725,173 B2 | 4/2004 | An et al. | 702/141 |
| 6,813,584 B2 | 11/2004 | Zhou et al. | 702/151 |
| 6,836,971 B1 | 1/2005 | Wan | 33/356 |
| 6,871,411 B1 | 3/2005 | Kang et al. | 33/356 |
| 6,877,237 B1 | 4/2005 | Withanawasam | 33/356 |
| 6,957,156 B2 | 10/2005 | Jo et al. | 702/51 |
| 6,962,001 B2 | 11/2005 | Yano et al. | 33/355 R |
| 6,964,107 B1 | 11/2005 | Ahola | 33/356 |
| 7,069,663 B2 | 7/2006 | Kwon et al. | 33/356 |
| 7,119,533 B2 | 10/2006 | Tamura et al. | 324/202 |
| 7,155,836 B2 | 1/2007 | Kwon et al. | 33/356 |
| 7,159,326 B2 | 1/2007 | Linjama | 33/356 |
| 7,177,779 B2 | 2/2007 | Hikida et al. | 702/150 |
| 7,210,235 B2 | 5/2007 | Sato | 33/355 R |
| 7,210,236 B2 | 5/2007 | Sato et al | 33/356 |
| 7,237,343 B2 | 7/2007 | Sato et al. | 33/356 |
| 7,278,219 B2 | 10/2007 | Honkura et al. | 33/356 |
| 7,340,362 B2 | 3/2008 | Kitamura et al. | 702/95 |
| 7,376,527 B2 | 5/2008 | Hikida et al. | 702/92 |
| 2003/0096623 A1 | 5/2003 | Kim | 455/456 |
| 2005/0004752 A1 | 1/2005 | Choi et al. | 701/207 |
| 2005/0037780 A1 | 2/2005 | Kuo et al. | 455/457 |
| 2005/0228603 A1 | 10/2005 | Fillatreau et al. | 702/92 |
| 2006/0031014 A1 | 2/2006 | Sato et al. | 701/224 |

(Continued)

FOREIGN PATENT DOCUMENTS

| | | |
|---|---|---|
| EP | 0 225 493 A2 | 6/1987 |
| EP | 2 495 573 A1 | 2/2011 |

(Continued)

*Primary Examiner* — Manuel L Barbee
(74) *Attorney, Agent, or Firm* — Harrington & Smith

(57) ABSTRACT

A method including switching hardware into a pre-calibration mode; and using the hardware to selectively pre-store measured data for calibration.

20 Claims, 4 Drawing Sheets

(56) References Cited

U.S. PATENT DOCUMENTS

| | | | |
|---|---|---|---|
| 2006/0052132 A1 | 3/2006 | Naukkarinen et al. | 455/556.1 |
| 2006/0152217 A1 | 7/2006 | Withanawasam | 324/244 |
| 2006/0190174 A1 | 8/2006 | Li et al. | 701/224 |
| 2007/0124075 A1 | 5/2007 | Lee et al. | 701/220 |
| 2007/0198209 A1 | 8/2007 | Sato | 702/155 |
| 2007/0213950 A1 | 9/2007 | Handa | 702/95 |
| 2007/0250262 A1 | 10/2007 | Lee et al. | 701/207 |
| 2010/0312510 A1* | 12/2010 | Piemonte et al. | 702/93 |

FOREIGN PATENT DOCUMENTS

| | | |
|---|---|---|
| EP | 2 397 817 A2 | 12/2011 |
| EP | 2 447 730 A1 | 5/2012 |
| GB | 2 213 937 A | 8/1989 |
| WO | WO 2005/027364 A1 | 3/2005 |
| WO | WO 2006/090197 A1 | 3/2006 |
| WO | WO 2006/088057 A1 | 8/2006 |
| WO | WO 2007/129653 A1 | 11/2007 |
| WO | WO 2010/114430 A1 | 10/2010 |
| WO | WO 2010114430 A1 * | 10/2010 |

* cited by examiner

US 8,843,338 B2

PROCESSING DATA FOR CALIBRATION

TECHNOLOGICAL FIELD

Embodiments of the present invention relate to collecting data for calibration. In particular, they relate to collecting data for calibration where the data is magnetic field data.

BACKGROUND

Sensors measure data. However, the measurement of the data by the sensor may be affected by time-varying factors. It may therefore be desirable to calibrate the interpretation of measured data so that it can be correctly interpreted.

As an example, a magnetometer measures magnetic field. This may, for example, be used as a compass in a mobile electronic device. The magnetometer may have a fixed relationship to the co-ordinate frame of the mobile device. Measuring the earth's magnetic field relates the magnetometer to the co-ordinate system of the earth. It is then possible to relate the co-ordinate system of the mobile device to the co-ordinate system of the earth, giving a heading for the mobile device.

However, the magnetic field measured by the mobile device can be influenced by factors that are independent of the orientation of the mobile device such as, for example, the presence of a ferro-magnetic material.

It is therefore generally accepted that for magnetometer sensor calibration it is best practise to perform measurements at the magnetometer when the mobile device has a number of different orientations.

It is, however, inconvenient to require a user to perform a pre-determined gesture that orientates the device while acquiring the necessary measurement data for calibration.

BRIEF SUMMARY

According to various, but not necessarily all, embodiments of the invention there is provided a method and apparatus as claimed in the appended claims.

BRIEF DESCRIPTION

Figure 1A:
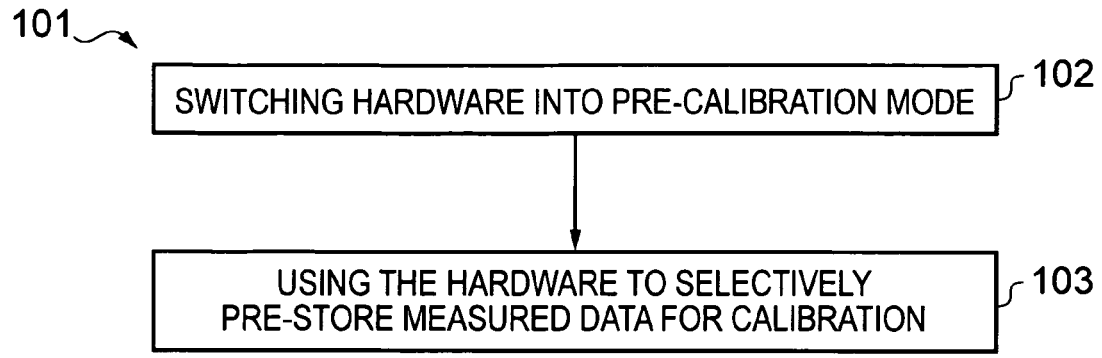
Figure 1B:
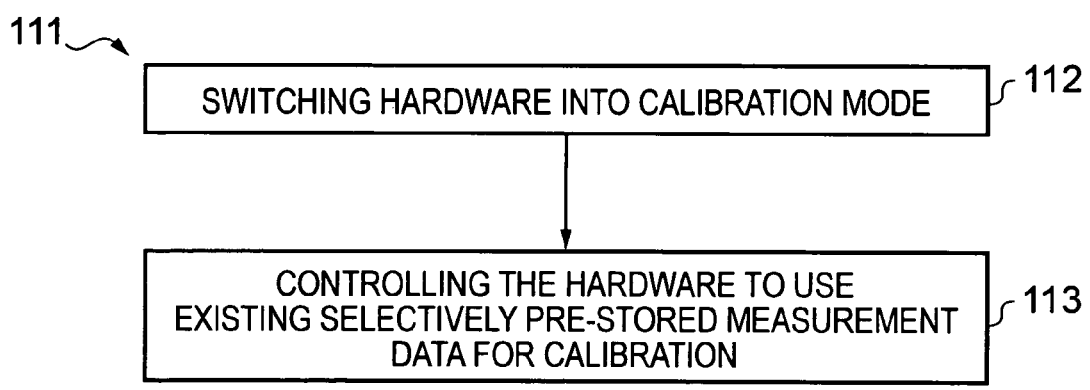
Figure 1C:
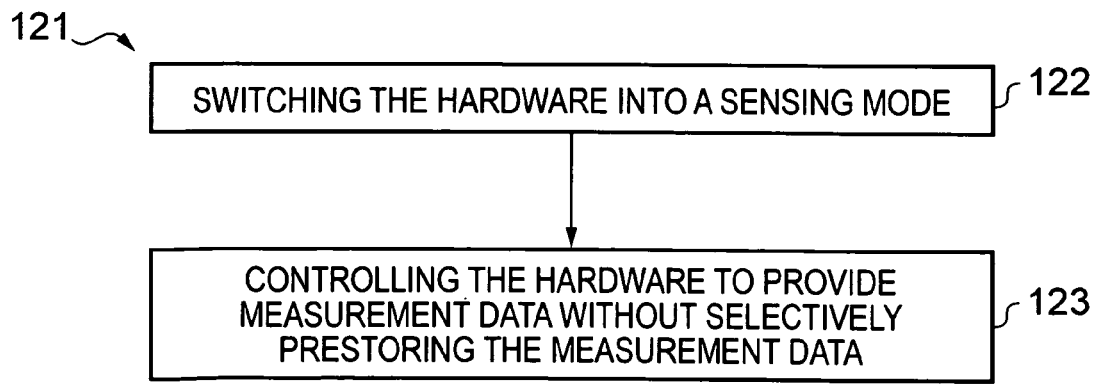
Figure 2:
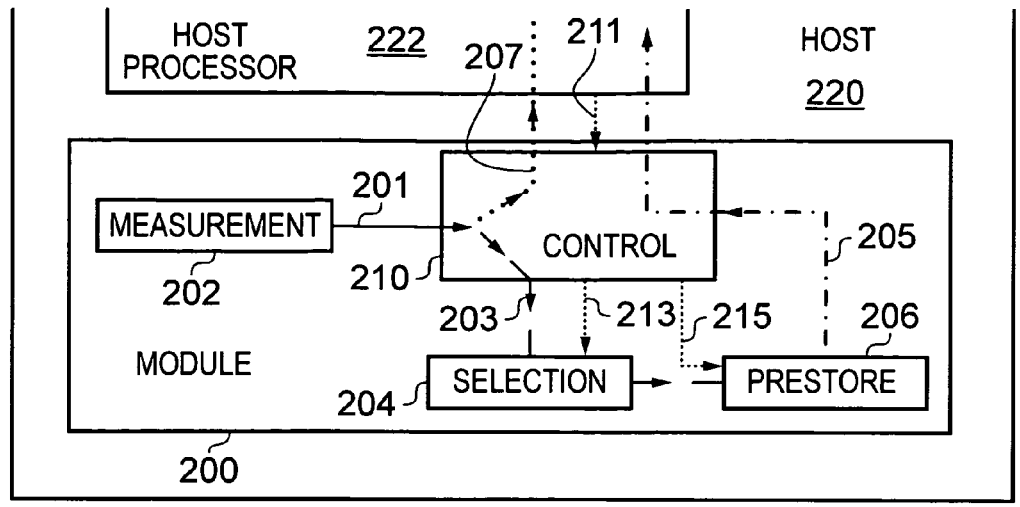
Figure 3:
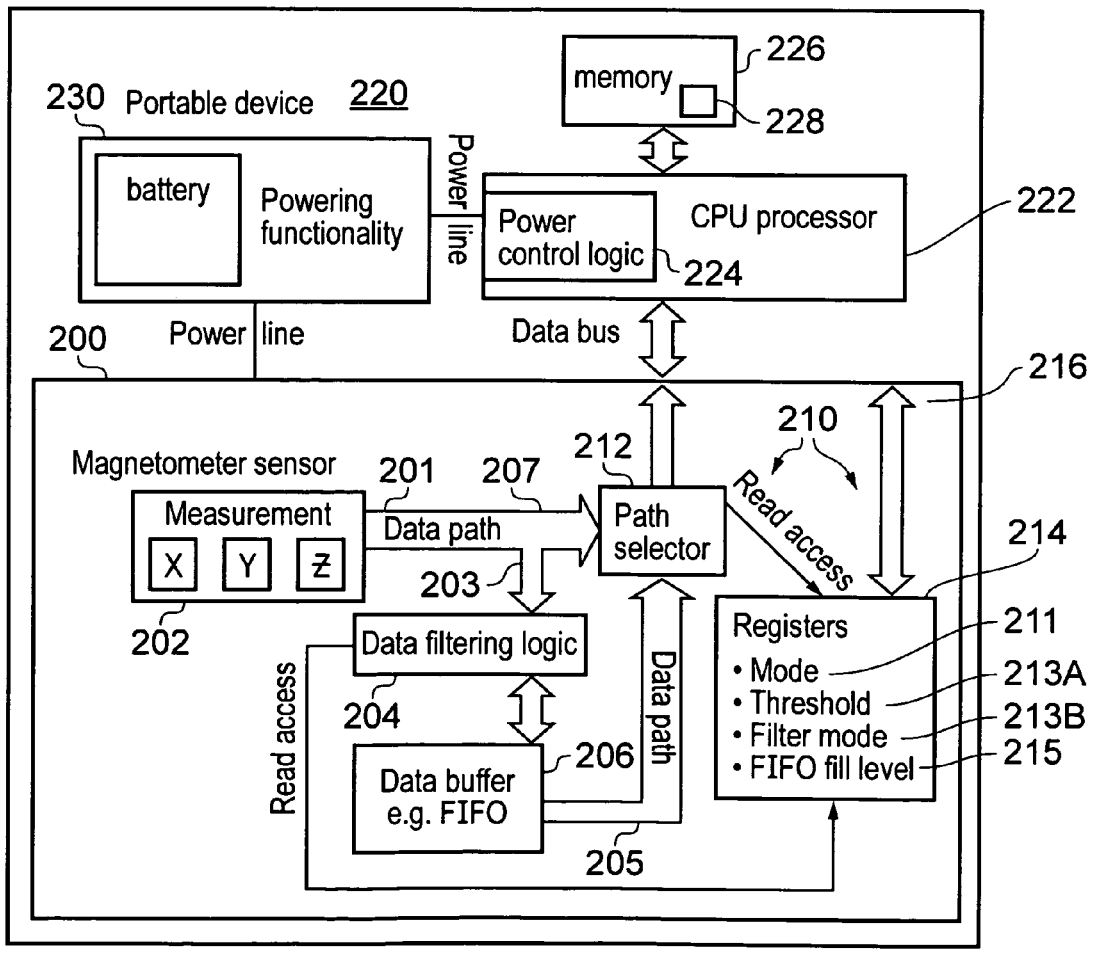
Figure 4:
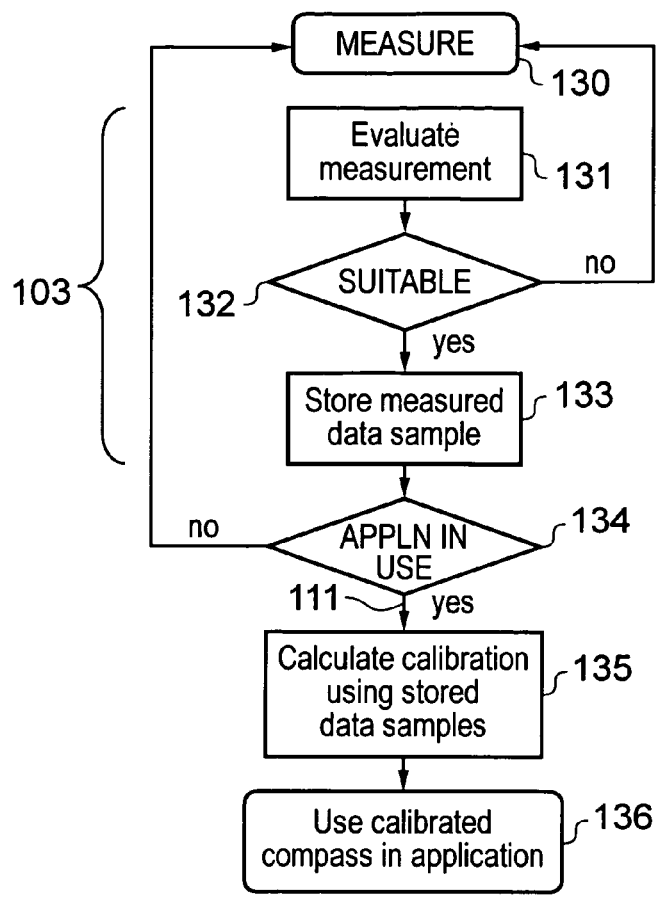
Figure 5:
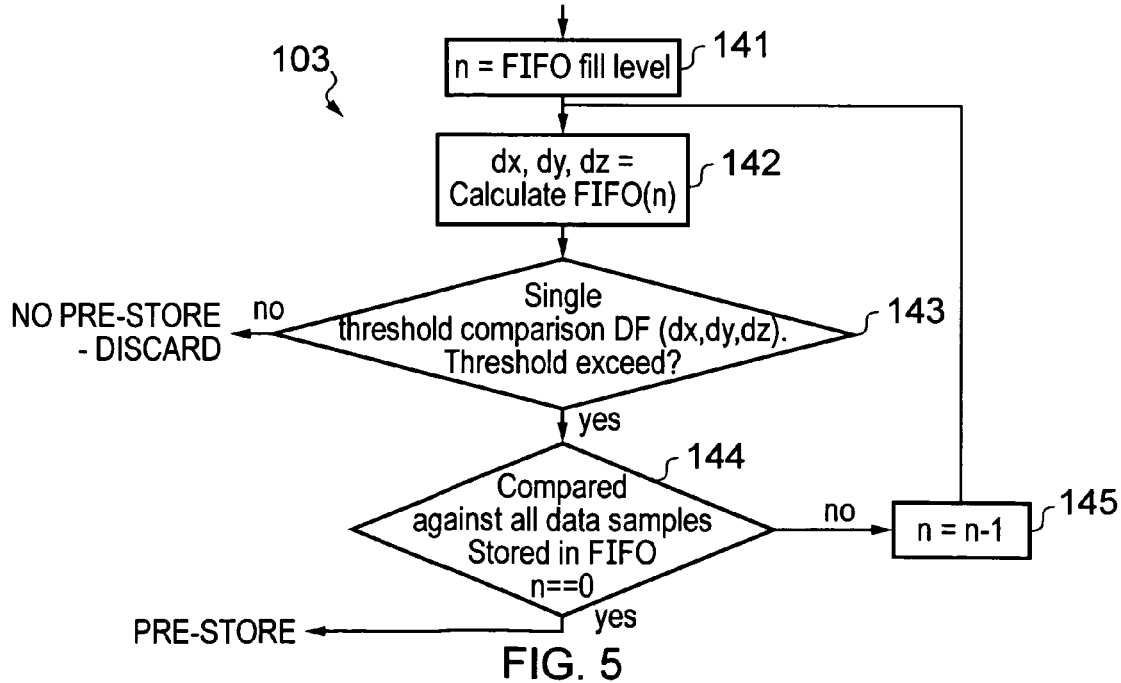
Figure 6A:
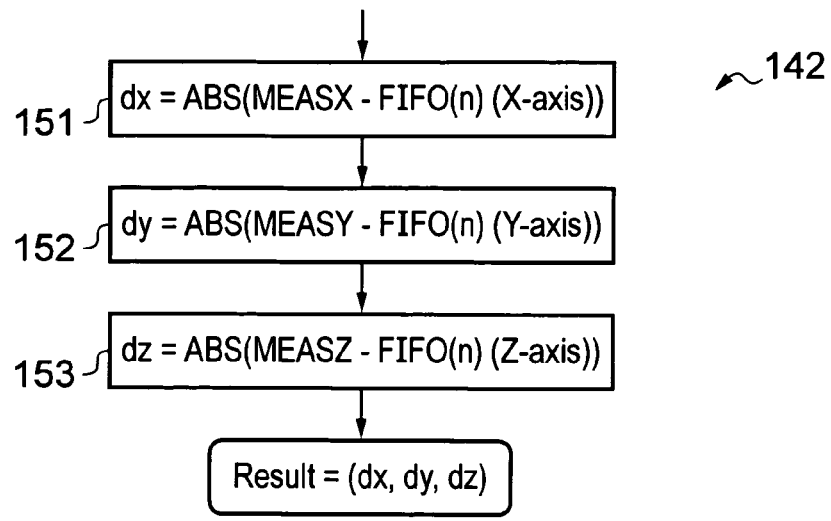
Figure 6B:
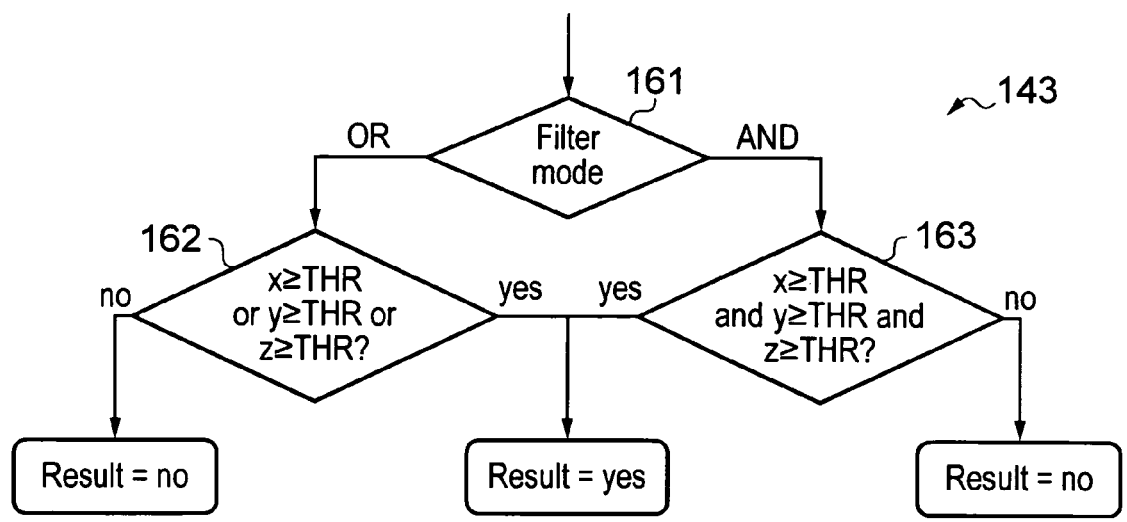

For a better understanding of various examples of embodiments of the present invention reference will now be made by way of example only to the accompanying drawings in which:

FIG. 1A schematically illustrates a method that is operational during a pre-calibration mode and selectively pre-stores measured data for calibration;

FIG. 1B schematically illustrates a method that is operational during a calibration mode and in which the existing selectively pre-stored measurement data is used for calibration;

FIG. 1C schematically illustrates a method that is operational during a sensing mode and in which measurement data is provided without selectively pre-storing the measurement data;

FIG. 2 schematically illustrates an example of a hardware module for performing the methods of FIGS. 1A to 1C and a host apparatus for controlling the hardware module;

FIG. 3 schematically illustrates an alternative embodiment to FIG. 2 in which further details of the hardware module are illustrated;

FIG. 4 schematically illustrates an example method in which switching between the pre-calibration mode and the calibration mode is illustrated;

FIG. 5 schematically illustrates an example of how selection of measurement data for pre-storage may be performed;

FIG. 6A schematically illustrates an example of a comparison block performed in FIG. 5;

FIG. 6B schematically illustrates an example of a decision block performed in FIG. 5.

DETAILED DESCRIPTION

This hardware is separate to a host processor 222 of a host apparatus 220 (FIGS. 2, 3). It is therefore possible for the hardware 200 to be permanently enabled without the consumption of excessive power. The host processor 222 can therefore be disabled and does not need to be used in the performance of the method of FIG. 1A. The host processor 222 may, however, when it is operational effect some control over the hardware 200. The hardware 200 can therefore effectively perform the methods of FIG. 1A as a background task while the host processor 222 is not operational.

FIG. 1A schematically illustrates a method 101 that is operational during a pre-calibration mode and selectively pre-stores measured data for subsequent calibration. The method 101 starts at block 102 with the switching of the hardware 200 into a pre-calibration mode. This is followed at block 103 by the hardware 200 selectively pre-storing measured data for calibration.

FIG. 1B schematically illustrates a method 111 that is operational during a calibration mode and uses the existing selectively pre-stored measurement data for calibration. The method 111 starts at block 112 with the switching of the hardware 200 into a calibration mode. In this mode, at block 113, the hardware 200 uses the existing selectively pre-stored measurement data for calibration. This is the measurement data that was selectively pre-stored in FIG. 1A. The actual processing required for calibration may be performed by the host processor 220 after transfer of the pre-stored measurement data from the hardware 200 to the host processor 200. Alternatively the processing required for calibration may be fully or partially performed the hardware 200.

FIG. 1C schematically illustrates a method 121 that is operational during a sensing mode and in which measurement data is provided without selectively pre-storing the measurement data. The method 121 starts at block 122 with the switching of the hardware 200 into a sensing mode. In the sensing mode, the hardware 200 provides measurement data without selectively pre-storing the measurement data.

It will therefore be appreciated that the calibration process is divided into a pre-calibration mode and a calibration mode. The pre-calibration mode can, for example, continue without the output of measurement data from the hardware 200. Thus it is possible for the host processor 222 to be disabled while the hardware 200 is in the pre-calibration mode.

FIG. 2 schematically illustrates an example of a hardware module 200 for performing the methods of FIGS. 1A to 1C and a host apparatus 220 for controlling the hardware module 200. The host apparatus 220 comprises a host processor 222 and the hardware module 200 which is used for measurement of data. The module 200 comprises measurement circuitry 202, control circuitry 210, selection circuitry 204 and pre-storage circuitry 206.

When the module 200 switches into the pre-calibration mode, the control circuitry 210 controls the path 203 for the measurement data 201 output by the measurement circuitry 202 so that it is provided to the selection circuitry 204. This path 203 is indicated by a dashed line. The selection circuitry 204, in this example, filters the received measurement data 201 and provides to the pre-stored circuitry 206 measurement data that is suitable for calibration. In this way the module 200 selectively pre-stores measurement data for calibration in the pre-storage circuitry 206.

When the module 200 is in the calibration mode, the control circuitry 210 controls the pre-storage circuitry 206 so that it provides the content of the pre-storage circuitry 206 to the host processor 222 along data path 205. This path is illustrated using a dot-dash line. The host processor 222 can then use the selectively pre-stored measurement data to perform a calibration.

When the module 200 is in the sensing mode, the control circuitry 210 controls the data path 207 of the measurement data 201 output from the measurement circuitry 202 so that it is provided to the host processor 222. It is not provided to the selection circuitry 204. This data path 207 is illustrated using a dotted line.

It will therefore be appreciated that in the pre-calibration mode measurement data 201 is provided via data path 203 without significant delay to the pre-storage circuitry 206 after it has been filtered by the selection circuitry 204. In the sensing mode, the measurement data 201 is provided without significant delay via the data path 207 to the host processor 222. In the calibration mode, pre-stored data from the pre-storage circuitry 206 is provided along the data path 205 to the host processor 222.

The host processor 222 may provide some configurable control 211 of the control circuitry 210 of the module 200. The configurable control may, for example, control the operation mode of the module 200. It may, for example, switch the module 200 into the pre-calibration mode, the calibration mode or the sensing mode. In addition, the configurable control 211 may control 213 the operation of the selection circuitry 204. The configurable control 211 provided by the host processor 222 may also be used to control the pre-storage circuitry 206. This configurable control may be performed by controlling the selection circuitry 204 and/or the pre-storage circuitry 206 during the calibration mode or the sensing mode while the host processor 222 is enabled so that the host processor 222 does not need to be enabled during the pre-calibration mode.

FIG. 3 schematically illustrates an alternative embodiment to FIG. 2 in which further details of the hardware module 200 are illustrated. FIG. 3 schematically illustrates a host apparatus 220 which in this example is a portable device such as, for example, a mobile telecommunications device, a personal electronic device or another device that is sized to be portable by a user. It may, for example, be hand-portable, which means that it is of a size so that it can be carried in the palm of the hand and will fit within a jacket pocket.

In the example of FIG. 3, the module 200 is a magnetometer sensor. The measurement circuitry 202 comprises a magnetometer. In this example the measurement circuitry 202 comprises three separate magnetometers which are arranged along orthogonal axes x, y, z. The measurement data 201 consequently has three components MEASX, MEASY and MEASZ corresponding to measurements made by magnetometers aligned with the x, y and z axes respectively.

The control circuitry 210 comprises path selector circuitry 212 which selects whether the measurement data 201 is provided to the host processor 222, whether the selectively pre-stored measurement data is provided via data path 205 to the host processor 222 or whether no data is provided to the host processor 222. It will be appreciated that these three different scenarios relate to respectively the sensing mode, the calibration mode and the pre-calibration mode.

The control circuitry 210 additionally comprises a set of registers 214. These registers store parameters which can be read by other circuitry in the module 200 to control their performance. The set of registers 214 is connected to the host apparatus 220 via an interface 216. This enables the host processor 222 to write to the registers when it is enabled and consequently to control the operation of the module 200 when the host processor 222 is disabled.

The parameters stored in the register 214 may, for example, include a mode parameter 211 that controls the mode of the module 200. Writing a particular value to this register switches the module 200 into the pre-calibration mode, the calibration mode or the sensing mode.

The parameters 213A, 213B may be used to define selection criteria in the selection circuitry 204. These criteria may be used to determine whether or not measured data is suitable for use in calibration and should therefore be pre-stored in the pre-storage circuitry 206. For example, the selection criteria may include a threshold 213A and/or a filter mode parameter 213B which determines the filter mode used by the selection circuitry 204.

As another example, the set of registers 214 may store a parameter value that controls the operational size of the pre-storage circuitry 206.

The selection circuitry 204 comprises data filtering logic which is configured to perform a read access to the set of registers 214. It may, for example, read the parameter values 213A and 213B. This determines the selection criteria used by a configurable filter of the selection circuitry 204.

The pre-storage circuitry 206 may be a data buffer. It may, for example, be a first-in-first-out (FIFO) memory. The operation of a FIFO memory is well understood in the art. The oldest stored data entry is deleted to make room for the newest data entry.

The host processor 222 in this example is a central processing unit. It includes a power control logic 224 which can, for example, be used to control the mode of operation of the module 200.

The host processor 222 is arranged to read from and write to a memory 226 which comprises a computer program 228. The computer program 228 when read by the host processor 222 may control the operation of the host apparatus 220.

In this figure there is also illustrated powering functionality circuitry 230 which includes a battery. This circuitry provides power to the host processor 222 and also to the module 200.

FIG. 4 illustrates an example method in which the mode of operation of the module 200 is switched between a pre-calibration mode and a calibration mode when a compass application is started.

At block 130 the measurement circuitry 202 measures data 201.

Next, at block 131 the selection circuitry 204 evaluates the measurement data based on selection criteria. Next, at block 132, it is determined at the selection circuitry whether or not the measurement data is suitable for use in a calibration process. If the measurement data is not suitable for use in a calibration process the method returns to block 130 and the measurement data is not used for calibration. If the measurement data is suitable for use in a calibration process the method moves on to block 133.

At block 133 the selected measurement data is pre-stored in the pre-storage circuitry 206.

It will be appreciated that blocks 131, 132 and 133 correspond to block 103 in FIG. 1A. Namely, they provide an example of using the hardware 200 to select the pre-stored measured data for calibration.

Next, at block 134, it is determined by the host processor 222 whether or not a compass application or a similar application that requires the use of the measurement data has been enabled. If there is no need for the measurement data at the host processor 222 because, for example, the compass application has not been enabled or is not in use then the method returns to block 130. However, if there is an immediate need for the measurement data by the host processor 222 because it is needed for a current in-use application then the method moves to block 135. The movement of the method to block 135 signifies the switching of the hardware 200 into the calibration mode. In this mode the hardware 200 is controlled to use the existing selectively pre-stored measurement data for calibration. The pre-storage circuitry 206 is controlled to output the selectively pre-stored measurement data to the host processor 222.

Next, at block 135, the host processor 222 performs calibration using the received selected pre-stored measured data.

Next, at block 136, the host processor 222 uses the calibrated compass in the compass application.

It should therefore be appreciated that blocks 134, 135 and 136 occur at the host processor 222.

FIG. 5 schematically illustrates an example of how selection of measurement data for pre-storage may be performed. The selection circuitry 204 performs the method of selecting measurement data for pre-storage. FIG. 5 provides one example of how this may be achieved. The method is used to determine whether candidate measurement data for pre-storage is suitable for pre-storage. If the candidate measurement data is suitable for pre-storage it is pre-stored, otherwise it is discarded.

It is certainly desirable for the measurement data used for calibration to span a broad range of possible values for the measurement data. Therefore the criteria that may be used to determine whether or not measurement data is suitable for pre-storage is whether or not that candidate measurement data is too similar to existing pre-stored measurement data. If the candidate measurement data differs significantly from measurement data that has already been pre-stored then the candidate measurement data is suitable for pre-storage. A selection criteria may be used to define "differs significantly".

At block 141, the loop is initiated by setting an index n, which is used to reference entries in the FIFO, equal to the FIFO fill level. The fill level is a parameter 215 that may be controlled by the host processor 222 writing to the set of registers 214. The FIFO fill level controls the operational size of the FIFO.

In this example, the measurement circuitry 202 is that used in FIG. 3, namely it is a three axis magnetometer sensor. The candidate measurement data (MEASX, MEASY, MEASZ) therefore has three orthogonal components. Each component (MEASX, MEASY, MEASZ) is compared against the corresponding component of an existing pre-stored measurement data value reference by index n at block 142 to produce component difference (dx, dy, dz).

Next, at block 143, it is determined whether the component differences (dx, dy, dz) between the candidate measurement data and the pre-stored measurement data is significant. If the differences are not significant then the candidate measurement data is not pre-stored and is discarded. If, however, the differences are significant then the method moves to block 144. At block 144 the method loops via block 145 so that blocks 142 and 143 are repeated for next one of the pre-stored measurement data values while the candidate measurement data value remains the same. If, however, all of the pre-stored measurement data values have been assessed against the candidate measurement data value then at block 144 the method finishes and the candidate measurement data is pre-stored in the pre-storage circuitry 206.

FIG. 6A illustrates an example of how block 142 may be performed. Block 151 determines the absolute difference dx between the candidate measurement value (MEASX) and the existing pre-stored measurement data at position n of the storage circuitry 206 (FIFO(n)) for the x axis component.

Block 152 determines the absolute difference dy between the candidate measurement value (MEASY) and the existing pre-stored measurement data at position n of the storage circuitry 206 (FIFO(n)) for the y axis component.

Block 153 determines the absolute difference dz between the candidate measurement value (MEASZ) and the existing pre-stored measurement data at position n of the storage circuitry 206 (FIFO(n)) for the z axis component.

FIG. 6B schematically illustrates an example of how block 143 may be performed in FIG. 5. At block 161 the filter mode is determined. If the filter mode is an "OR" filter mode then the method moves to block 162. If the filter mode is an "AND" filter mode then the method mode moves to block 163.

In the OR filter mode, the selection criteria requires that at least one of the orthogonal components of the candidate measurement data differs significantly from the same corresponding orthogonal component of all existing pre-stored measurement data.

In the AND filter mode, the selection criteria requires that all of the orthogonal components of the candidate measurement data are significantly different from all of the components for all the existing pre-stored measurement data.

In the example illustrated, at block 162 one of the absolute differences dx, dy or dz needs to exceed a threshold. It may be possible to have the same threshold used for each of dx, dy and dz or to use different thresholds for dx, dy and dz. If there is no significant difference for at least one of the orthogonal components then block 162 fails. If, however, there is significant difference between one of the components then block 162 passes and referring back to FIG. 5 the method moves to block 144.

At block 163, all of the absolute differences dx, dy and dz have to exceed a threshold. This may be the same threshold or it may be a threshold that is particular to the orthogonal component. If the condition at block 163 fails then referring to FIG. 5 the method does not pre-store the candidate data and discards it and the method at FIG. 5 ends. If, however, the selection criteria is satisfied at block 163 then the method moves, in FIG. 5, to block 144.

Implementation of hardware can be in hardware alone (a circuit, an application specific processor . . . ) or can be a combination of hardware and software (including firmware).

As used in this application, the term 'hardware' refers to all of the following:

(a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'hardware' applies to all uses of this term in this application, including in any claims. As a further example, as used in this application, the term "hardware" would also cover an implementation of merely a processor (or multiple processors) or portion of a processor and its (or their) accompanying software and/or firmware.

As used here 'module' refers to a unit or apparatus that excludes certain parts/components that would be added by an end manufacturer or a user.

The blocks illustrated in the FIGS. 1A, 1B, 1C, 4, 5, 6A, 6B may represent steps in a method and/or sections of code in the computer program. The illustration of a particular order to the blocks does not necessarily imply that there is a required or preferred order for the blocks and the order and arrangement of the block may be varied. Furthermore, it may be possible for some blocks to be omitted.

Although memory 206 is described as a first-in-first-out memory it may alternatively be implemented as a memory that can trigger calibration by the host processor 222 even when the application is not in use. In FIG. 4, if the application is not in use at block 134 then instead of returning to block 130, it is tested whether or not the memory 206 is full. If it is not full, the method returns to block 130. However, if the memory 206 is full the host processor 222 performs calibration using the measurement data stored in the memory 206. The memory 206 is then emptied. Thus calibration may occur intermittently even when the application is not in use.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
switching a hardware module of an electronic device, which is separate to a host processor of the electronic device, into a pre-calibration mode, wherein the host processor is disabled; and
using the hardware module to selectively pre-store measured data for calibration.

2. A method as claimed in claim 1 further comprising using the hardware module to measure the measured data.

3. A method as claimed in claim 1, wherein the measured data is from a magnetometer comprising three orthogonal axes.

4. A method as claimed in claim 1 further comprising using a memory to pre-store the measured data wherein an operational size of the memory is configurable.

5. A method as claimed in claim 1, wherein a configurable filter is used to select measurement data for pre-storage.

6. A method as claimed in claim 1, wherein selection of measurement data for pre-storage is based upon one or more criteria.

7. A method as claimed in claim 6, wherein the one or more criteria is based upon the suitability of measurement data for use in calibration.

8. A method as claimed in claim 6, wherein the one or more criteria is used to determine whether candidate measurement data for pre-storage differs significantly from measurement data that has already been pre-stored.

9. A method as claimed in claim 8, wherein the candidate measurement data comprises a plurality of components and the at least one criteria requires that at least one of the components differs significantly from the same corresponding component of all existing pre-stored measurement data.

10. A method as claimed in claim 8, wherein the candidate measured data comprises a plurality of components and the at least one criteria requires that each component, of the plurality of components, differs significantly from the same corresponding component of all existing pre-stored measurement data.

11. A method as claimed in claim 1 further comprising switching the hardware module into a calibration mode; and controlling the hardware module to use existing selectively pre-stored measurement data for calibration.

12. A method as claimed in claim 11, wherein a host device to the hardware module controls switching of the hardware module between the pre-calibration mode and the calibration mode and the hardware module uses existing selectively pre-stored measurement data for calibration by providing the existing selectively pre-stored measurement data to the host device for processing.

13. A method as claimed in claim 12, wherein the host device switches modes in response to the enablement/disablement of an application that uses the measured data.

14. A method as claimed in claim 1 further comprising switching the hardware module into a sensing mode; and controlling the hardware module to provide measurement data without selectively pre-storing that measurement data.

15. A hardware module configured to perform the method of claim 1.

16. An apparatus comprising:
at least one processor; and
at least one memo including computer program code, where the at least one memory and the computer program code are configured, with the at least one processor, to cause the apparatus to at least:
switch a hardware module of an electronic device, which is separate to a host processor of the electronic device, between a first mode in which measured data is selectively pre-stored for calibration, wherein the host processor is disabled; and a second mode in which measured data is not selectively pre-stored.

17. An apparatus as claimed in claim 16 further comprising a magnetometer.

18. An apparatus as claimed in claim 16 wherein the at least one memory including the computer program code is configured with the at least one processor to filter the measured data before it is pre-stored.

19. An apparatus as claimed in claim 16 wherein the at least one memory including the computer program code is configured with the at least one processor to use at least one register to store one or more parameters for controlling operation of the apparatus and an interface configured to enable a host apparatus to write to the at least one register.

20. An apparatus as claimed in claim 19, wherein the at least one register is used to control any one or more of pre-storage of a measured data, the selection of the selectively pre-stored measurement data and the mode of operation of the apparatus.

* * * * *

UNITED STATES PATENT AND TRADEMARK OFFICE
CERTIFICATE OF CORRECTION

PATENT NO. : 8,843,338 B2  
APPLICATION NO. : 13/194269  
DATED : September 23, 2014  
INVENTOR(S) : Laaksonen et al.

Page 1 of 1

It is certified that error appears in the above-identified patent and that said Letters Patent is hereby corrected as shown below:

In the Claims

Claim 16, col. 8, line 38 "memo" should be deleted and --memory-- should be inserted.

Signed and Sealed this  
Sixth Day of January, 2015

Michelle K. Lee  
*Deputy Director of the United States Patent and Trademark Office*